United States Patent [19]

Fujii et al.

[11] 4,421,621
[45] Dec. 20, 1983

[54] QUARTZ CRYSTAL OSCILLATOR

[75] Inventors: Hiroyuki Fujii, Suwa; Joji Shimakawa, Minowa; Yukio Hara, Minowa; Masatoshi Kobayashi, Minowa, all of Japan

[73] Assignees: Kabushiki Kaisha Suwa Seikosha, Tokyo; Matsushimakogyo Kabushiki Kaisha, Nagano, both of Japan

[21] Appl. No.: 307,692

[22] Filed: Oct. 1, 1981

Related U.S. Application Data

[62] Division of Ser. No. 58,331, Jul. 17, 1979, abandoned.

[51] Int. Cl.³ ............................................. C23C 15/00
[52] U.S. Cl. .................. 204/192 C; 427/123; 427/124; 427/125; 427/69; 310/361
[58] Field of Search ............... 204/192 C; 310/361; 427/123, 124, 125, 69

[56] References Cited

U.S. PATENT DOCUMENTS 4,099,078 7/1978 Shibata et al. .................. 310/361
4,176,030 11/1979 Negita .................. 204/192 C

FOREIGN PATENT DOCUMENTS 2002955 2/1979 United Kingdom .

Primary Examiner—Arthur P. Demers
Attorney, Agent, or Firm—Blum Kaplan

[57] ABSTRACT

A quartz crystal oscillator including a quartz crystal plate defining a tuning fork having a base, two vibratory tines extending from the base and a frame integrally extending from the base and surrounding the tines is provided. The quartz crystal plate is disposed between two cooperating case members in the region of the base and frame. Thin metallic electrodes are disposed on the opposed planar surfaces of the quartz crystal plate. A through-hole or opening is formed in the base region of the vibrator plate for electrically connecting an electrode from one planar surface of the plate to the opposed planar surface for providing two external terminals on one surface case member. The electrical connection through the through-hole or opening is a thin metal film disposed by sputtering or deposition.

11 Claims, 11 Drawing Figures

QUARTZ CRYSTAL OSCILLATOR

This is a division of application Ser. No. 058,331, filed July 17, 1979, and now abandoned.

BACKGROUND OF THE INVENTION

This invention relates generally to an ultra-thin quartz crystal oscillator and in particular to a structural mode tuning fork quartz crystal vibrator wherein the tuning fork type quartz crystal vibrator is sandwiched between two cooperating case members with an external electrode wired through a through-hole or opening in the vibrator plate for providing two external electrodes on the same case member.

There is a pressing need for quartz crystal oscillators which are thin, small-size and can be produced at an overall low price. Such oscillators are required for making a thin electronic wristwatch which utilizes a quartz crystal oscillator as the time standard. In view of recent developments, the quartz crystal oscillator is the heart of these electronic wristwatches.

There are many proposals for providing thin, small-sized quartz crystal oscillators. Among these, the most attractive is the thin-plate tuning fork type quartz crystal vibrator including a frame integrally extending from the base of the tuning fork so as to surround the tine of the tuning fork. The vibrator is then sandwiched in between two opposed plates or box-shaped containers. This type of quartz crystal oscillator is worth considering in terms of its size and cost. However, there are serious shortcomings in using such a quartz crystal oscillator as it is expensive to produce due to special processing for conveniently providing the terminals in an easily accessible location for mounting the quartz crystal oscillator into the oscillator circuit. Accordingly, it is desirable to provide a thin-plate tuning fork type quartz crystal vibrator in a container which overcomes these disadvantages.

SUMMARY OF THE INVENTION

Generally speaking, in accordance with the invention, a flexural mode quartz crystal oscillator comprising a thin plate tuning fork type quartz crystal vibrator sandwiched between two opposed box-shaped container portions is provided. The quartz crystal oscillator includes a quartz crystal plate defining a tuning fork having a base, two vibratory tines extending from the base and a frame integrally extending from the base and surrounding the tines. Selective regions of the opposed planar surfaces of the base, tines and frame have thin metallic electrodes selectively disposed thereon. The quartz crystal vibrator plate is positioned between a pair of opposed cooperating oscillator case members formed with cavities for receiving the tines and retaining the quartz crystal plate in the region of the base and frame. The base region of the plate is formed with a through-opening or hole and has a metallic electrode disposed in the opening for electrically coupling one of the electrodes from one planar surface of the vibrator to the opposed planar surface for providing mounting terminals for the oscillator on one case portion. A through-hole or opening may be provided in the case member for providing external electrodes on the outer surfaces of the oscillator.

Accordingly, it is an object of the invention to provide an improved quartz crystal oscillator.

A further object of the invention is to provide an improved quartz crystal oscillator of the thin plate tuning fork type.

Another object of the invention is to provide an improved quartz crystal oscillator of the thin plate tuning fork type including a quartz crystal vibrator formed with a frame integrally extending from the base of the tuning fork in a vibrator case.

Still another object of the invention is to provide a quartz crystal oscillator including a thin plate tuning fork type quartz crystal vibrator disposed in an oscillator case having conveniently located electrode terminals on one surface of the oscillator case.

Still a further object of the invention is to provide a quartz crystal oscillator of the thin plate tuning fork type including a quartz crystal vibrator disposed in an oscillator case wherein electrodes from opposed surfaces of the vibrator leaf are coupled to oscillator terminals on one surface of the case through an opening or hole formed in the vibrator plate with a thin metal film disposed in the opening.

Another object of the invention is to provide a method for preparing a quartz crystal oscillator of the tuning fork type wherein a thin plate quartz crystal vibrator leaf is disposed in a box-shaped case and electrical connections to the oscillator terminal is provided through an opening or hole formed in the base of the quartz crystal vibrator.

A further object of the invention is to provide a method for manufacturing a quartz crystal oscillator having a thin-film electrode in a through-opening or hole in a vibrator plate for providing electrical connection to an opposite surface of the vibrator plate.

Still other objects and advantages of the invention will in part be obvious and will in part be apparent from the specification.

BRIEF DESCRIPTION OF THE DRAWINGS

For a fuller understanding of the invention, reference is had to the following description taken in connection with the accompanying drawings, in which:

FIG. 4b is a bottom plan view of the quartz crystal vibrator leaf illustrated in FIG. 4a;

DESCRIPTION OF THE PREFERRED EMBODIMENTS

Figure 1:
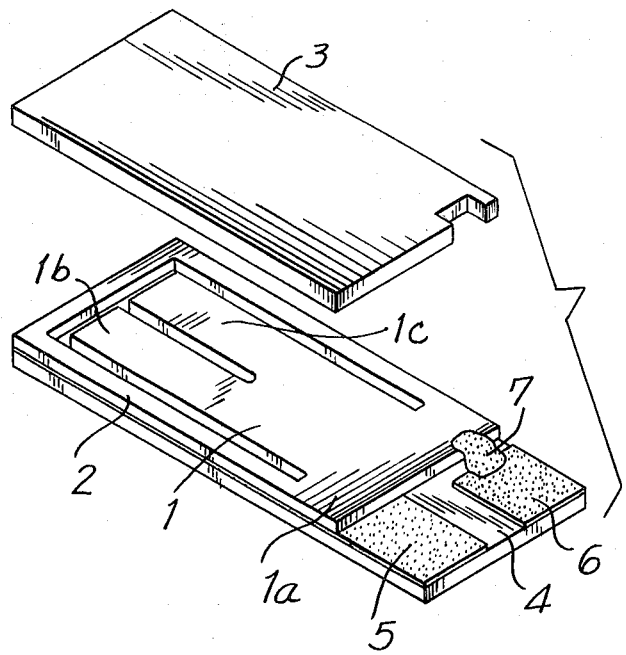
FIG. 1 is a partially exploded perspective view of a conventional quartz crystal vibrator in an oscillator container.

FIG. 1 illustrates a conventional means for providing external electrodes on one surface of the body of the base of a quartz crystal tuning fork oscillator. The quartz crystal oscillator of FIG. 1 includes a quartz crystal vibrator including a quartz crystal tuning fork 1 having a base 1a a unitary frame 2 extending from base 1a and surrounding vibratory tines 1b and 1c. Frame 2 is disposed and sealed in a container including a box-shaped upper case member 3 and a cooperating lower case member 4. The joints between the members are sealed by a low melting point eutectic and the structure is hermetically sealed.

The oscillator of FIG. 1 includes a first external electrode 5 and a second external electrode 6 formed on the inner surface of lower case member 4. In the quartz crystal oscillator illustrated, first external electrode 5 extends from the lower surface of quartz crystal tuning fork 1 along the upper surface of frame 2. An electrically conductive paste 7 is disposed between external electrode 6 and the upper surface of quartz crystal tuning fork 1 for providing electrical connection therebetween.

In this type of construction, joining of external electrode 6 and the electrode disposed on the upper surface of quartz crystal tuning fork 1 must be done after sealing vibrator 1 between upper case member 3 and lower case member 4. As a result, an additional process step of paste joining is required which results in an unacceptable process from an automation perspective. In this respect, by constructing the oscillator in this batch manner, one does not take full advantage of available chemical etching techniques. Quartz crystal oscillators constructed and arranged in accordance with the invention avoid the above noted disadvantages.

Figure 2:
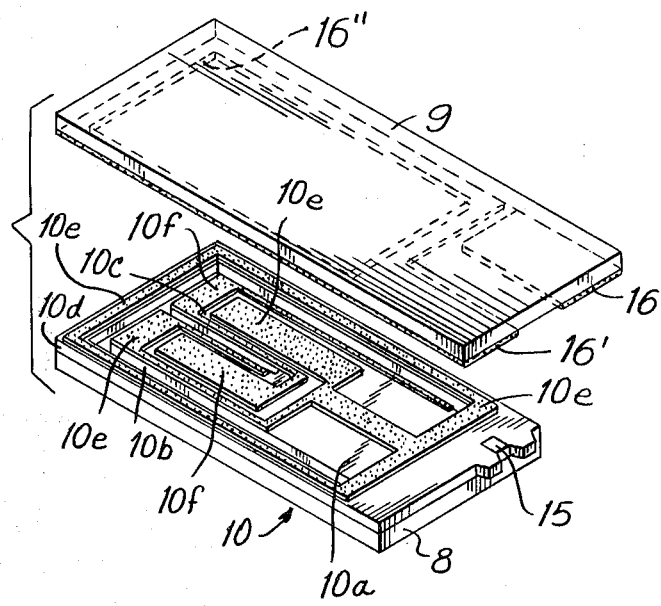
FIG. 2 is a partially exploded view of a quartz crystal vibrator in an oscillator container in accordance with an embodiment of the invention.
Figure 3:
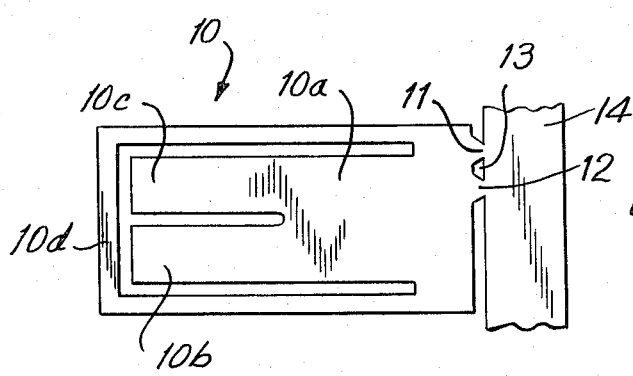
FIG. 3 is a plan view illustrating a stage in the formation of the oscillator of FIG. 2.

Referring now to FIG. 2, an exploded perspective view of a tuning fork type quartz crystal oscillator constructed and arranged in accordance with the invention is shown. A tuning fork quartz crystal vibrator 10 having a base 10a, two vibratory tines 10b and 10c and a frame 10d extending from base 10a about tines 10b and 10c is formed by chemical etching. As shown in FIG. 3, when vibrator plate 10 is formed, it is connected to a frame 14. In this embodiment of the invention, a through-opening 13 is formed in an edge of base 10a between two connecting portions 11 and 12 provided in predetermined positions on frame 14.

Figure 4A:
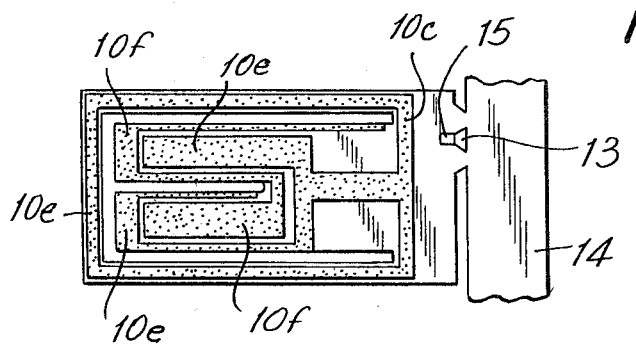
FIG. 4a is a top plan view of the thin plate tuning fork type quartz crystal vibrator plate of FIG. 3 with electrodes disposed thereon.
Figure 4B:
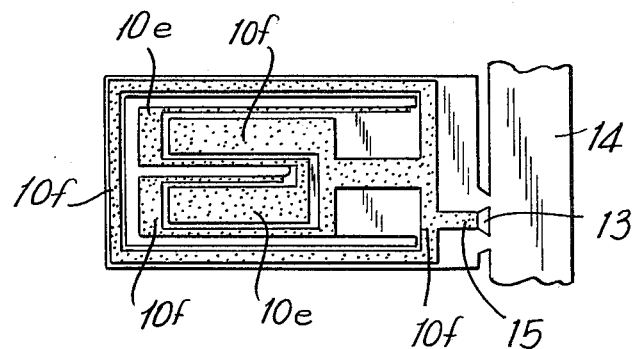

Turning now to FIGS. 3, 4a and 4b, the electrode configuration disposed on the upper and lower planar surfaces, respectively, of quartz crystal vibrator plate 10 is shown. The electrodes are disposed thereon by sputtering or vacuum deposition. The electrode pattern on the tines and base is the same as described in U.S. Pat. No. 4,099,078.

The upper planar surface of quartz crystal vibrator plate 10 shown in FIGS. 2 and 4a are formed with an upper surface electrode 10e extending about frame 10d and which extends across base 10a of vibrator 10 and extends to the peripheral sides of tines 10b and the center of tine 10c. A second surface electrode 10f extends from the central region of tine 10b having electrode 10e at its peripheral sides and extends to the peripheral sides of tine 10c not in contact with electrode 10e. Electrodes 10e and 10f are disposed on at least a portion of at least one of the lengthwise side edges of the respective tines for coupling the electrodes disposed on the bottom surface of quartz crystal vibrator leaf 10 as illustrated in FIG. 4b which utilizes the same reference numerals for surface electrodes in contact.

Through-opening 13 is formed through quartz crystal vibrator 10 and electrode 10f on the lower surface of vibrator 10 is formed with a coupling electrode portion 15 extending through-opening 13 to the upper surface of quartz crystal vibrator 10 as illustrated in FIGS. 2 and 4a. When quartz crystal vibrator 10 is placed between an upper case member 9 and a lower case member 8 and hermetically sealed therebetween with a low temperature binder, electrode portion 15 contacts an external electrode 16 formed on the lower surface of upper case member 9. A second external electrode 16' is formed on an opposite edge of the lower surface of upper case member 9 with a portion 16" about the frame region of upper case member 9 for mating with surface electrode 10e on frame 10d. This electrode configuration provides an external electrode pair 16 and 16' on the same surface of upper case member 9. Constructing and arranging and the quartz crystal oscillator in this manner makes the most of the advantages of forming the electrodes by chemical etching and disposing the electrodes by sputtering. This also avoids the batch treatment to deposit electrically conductive paste 7 for bringing one of the surface electrodes to the same side of the case as shown in FIG. 1.

Figure 5:
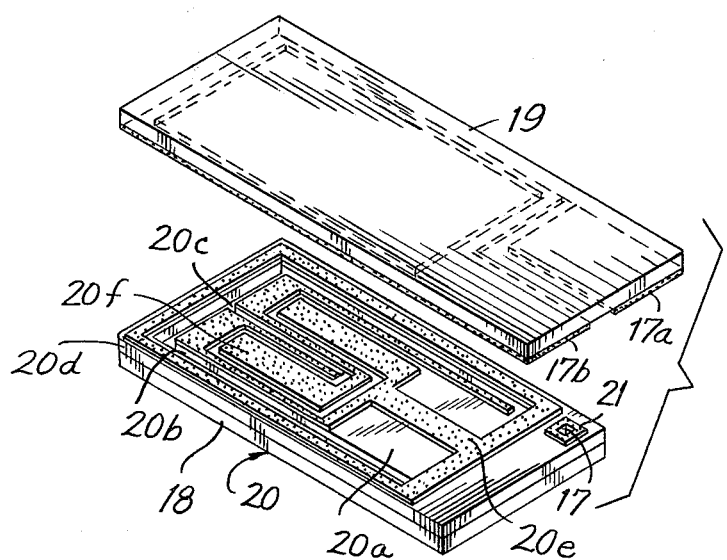
FIG. 5 is a partially exploded perspective view of a quartz crystal oscillator constructed in accordance with another embodiment of the invention.

Referring now to FIG. 5, another embodiment of a quartz crystal oscillator constructed and arranged in accordance with the invention is shown. A quartz crystal vibrator plate 20 having a base 20a, a frame 20b and vibratory tines 20c and 20d is shown positioned between a lower case member 18 and a cooperating upper case member 19. Vibrator plate 20 is formed with a first surface electrode 20e and a second surface electrode 20f on portions of both surfaces of both tines and has the same pattern as electrode 20f on portions of both surfaces of both tines and has the same pattern as electrodes 10e and 10f, respectively, for the embodiment of FIGS. 2–4b. Vibrator plate 20 is formed with a through-hole 17 in base 20a of vibrator plate 20. Through-hole 17 is formed by chemical etching and performs the same function as through-opening 13 of FIG. 2. Specifically, an electrode 21 is deposited about the side-walls of through-hole 17 in order to provide electrical connection between second surface electrode 20f on the lower surface of plate 20 to the upper surface. Thus, in this embodiment, upper case 19 formed with an external electrode 17a on the lower surface thereof electrically contacts electrode 21 when the oscillator is sealed. In addition, upper case 19 is formed with a second external electrode 17b for contacting first surface electrode 20e formed on the upper surface about frame 20a of vibrator plate 20. Thus, a quartz crystal oscillator having a pair of external electrodes 17a and 17b on one surface of upper case member 19 is provided for facilitating mounting of the oscillator into an oscillator circuit.

Figure 6:
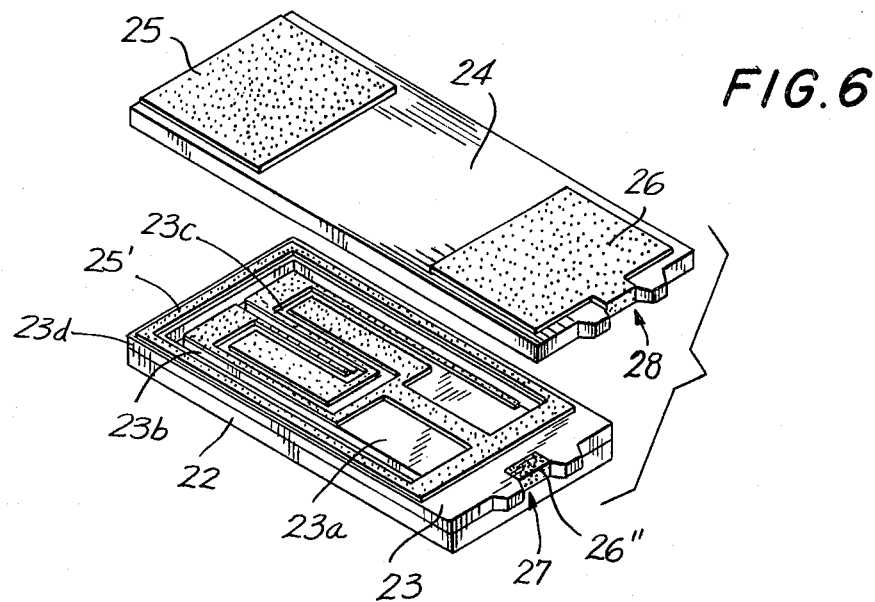
FIG. 6 is a partially exploded perspective view of a quartz crystal oscillator constructed in accordance with a further embodiment of the invention.
Figure 7:
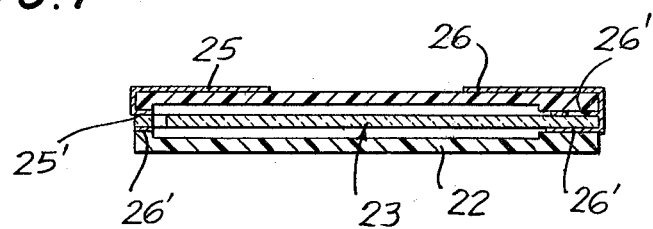
FIG. 7 is a cross-sectional view showing the electrode pattern of an oscillator of the type illustrated in FIG. 6.

Referring now to FIGS. 6 and 7, a quartz crystal oscillator having external electrodes on an exterior surface in accordance with a further embodiment of the invention is shown. The quartz crystal oscillator includes a quartz crystal plate 23 having a base 23a, a pair of vibratory tines 23b and 23c and a frame 23d extending from base 23a and surrounding tines 23b and 23c. When the oscillator is assembled, vibrator plate 23 is disposed between an upper case member 24 and a cooperating lower case member 22 at base 23a and frame 23d. A through-opening 27 is formed of the edge of base 23a of vibrator plate 23 and a cooperating through-opening 28 is formed on an edge of upper case member 24 for providing a pair of external electrodes, first external electrode 25 and second external electrode 26, on the outer surface of upper case member 24. FIG. 6 is a partially exploded new view illustrating this embodiment of the invention and FIG. 7 illustrates in a schematic cross-sectional representation of how the electrodes are disposed on plate 23 of the oscillator.

A first electrode 25' is disposed about the upper surface of plate 23 in the region about frame 23d, continues across a portion of base 23a and is channeled to first external electrode 25 through a sputtered film, such as Cr-Au, formed on the side edge of upper case member 24 in the region cooperating with frame 23d. Second external electrode 26' disposed on portions of the upper surface of tines 23d and 23c, not in contact with first electrode 25' and a corresponding portion of the lower surface of plate 23 is channeled to second external electrode 26 on the outer surface of upper case member 24 through through-opening 27 at base 23a and through-opening 28 in upper case member 24. The electrode pattern on the opposed planar surfaces of the vibratory tines 23b and 23c is the same as previously described with respect to the oscillator depicted in FIGS. 4a and 4b.

Referring now to FIG. 7, the schematic cross-sectional illustration shows the electrical connection between first electrode 25' and first external electrode 25 at the edge of upper case member 24. Similarly, the electrical connection between second surface electrode 26' from the lower surface of plate 23 through through-opening 27 to second external electrode 26 about the edge of through-opening 28 of upper case member 24 is also depicted. The electrodes are disposed on crystal vibrator plate 23 by the process of chemical etching.

Figure 8:
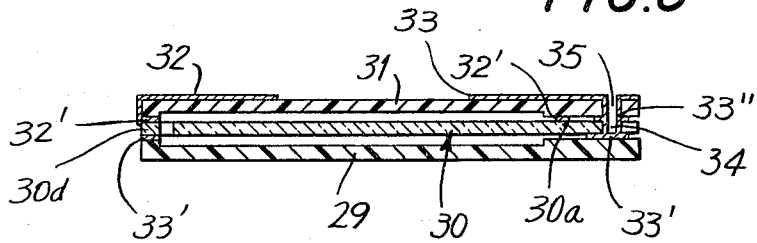
FIG. 8 is a cross-sectional view illustrating the electrode pattern of an oscillator of the type illustrated in FIG. 5.

A structure similar to that illustrated in the embodiment of FIG. 6 wherein external electrodes 25 and 26 are formed on the same outer surface upper case member 24 can be provided by a through-hole formed in the base of the vibrator plate and one of the case members as illustrated in FIG. 8. The quartz crystal oscillator illustrated in FIG. 8 includes a quartz crystal plate 30 formed with a base 30a and a pair of vibratory tines and a frame 30d as in the embodiment described above. The oscillator also includes a lower case member 29 and an upper case member 31. A first external electrode 32 and a second external electrode 33 are disposed on the upper surface of upper case member 31.

The electrode pattern on the vibratory tines of a first surface electrode 32' and a second surface electrode 33' is the same as in the oscillator illustrated in FIGS. 2–4b. First surface electrode 32' disposed about vibrator frame 30d and a portion of base 30a is electrically connected to first external electrode 32 about the edge region of upper case member 31. Second surface electrode 33' disposed about the lower surface of vibrator frame 30d and across portion of the lower surface of base 30a is electrically connected to second external electrode 33 through a through-hole 34 formed through a portion of vibrator base 30a and a cooperating through-hole 35 formed through upper case member 35.

A portion of electrically conducted material 33" is disposed in through-holes 34 and 35 by sputtering after assembly of the oscillator in a similar manner as described with respect to the embodiment illustrated in FIGS. 6 and 7.

Figure 9:
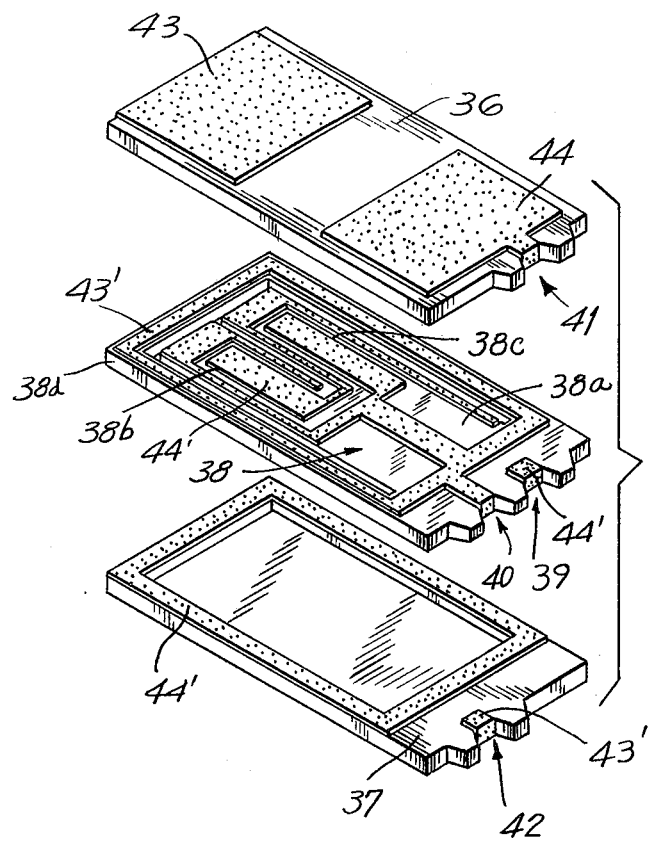
FIG. 9 is an exploded perspective view of a quartz crystal oscillator constructed in accordance with a preferred embodiment of the invention.
Figure 10:
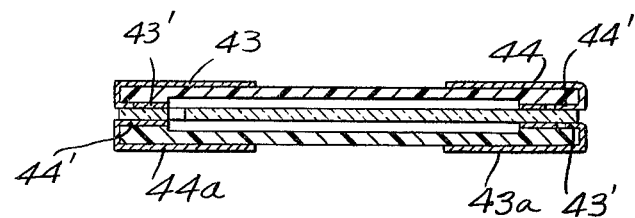
FIG. 10 is a cross-sectional view showing the electrode pattern of an oscillator of the type illustrated in FIG. 9.

Referring now to FIGS. 9 and 10, another exemplary embodiment of a quartz crystal oscillator having two pairs of external electrode constructed and arranged in accordance with the invention is shown. FIG. 9 is an exploded perspective view of the oscillator showing quartz crystal vibrator plate 38 having a base region 38a, a pair of vibratory tines 38b and 38c and a frame 38d extending from base 38z and surrounding tines 38b and 38c. FIG. 10 is a schematic cross-sectional view illustrating the electrical connections between the electrodes disposed on the surfaces of vibrator plate 38.

Referring specifically to FIG. 9, a first surface electrode film 43' is disposed on the upper surface of vibrator plate 38 extends about the frame 38d, a portion of base 38a and extends onto vibratory tines 38b and 38c in the same manner as described with respect to the embodiment illustrated in FIG. 2. A second surface electrode film 44' is disposed on a portion of vibratory tines 38b and 38c in a manner as described with respect to the embodiment of FIG. 2 and extends to the lower surface of plate 38 by regions of electrode film disposed at least a portion of the side edges of vibratory tine 38b and 38c.

In the oscillator constructed and arranged in accordance with this embodiment of the invention, a first external electrode 43 and a second external electrode 44 are provided on portions of both the upper surface of an upper case number 36 and a corresponding pair of external electrodes 43a and 44a are formed on the outer surface of a lower case member 37. The electrical connections between the corresponding pairs of external electrodes 43a and 44a and external electrodes 43 and 44 are shown more clearly on the schematic illustration in FIG. 10. First upper external electrode 43 is shown extending about the top edge of upper case member 36 to the upper surface of frame 38d. Similarly, second upper external electrode 44 is shown extending through a through-opening 41 in the edge of upper case member 36 cooperating with a first through-opening 39 in plate 38. Electrical connections at the lower case member 37 are made through a through-opening 42 formed in lower case member 37 for cooperating with a second through-opening 40 formed in the edge of base 38a of quartz crystal vibrator plate 38. Thus, a first pair of external electrodes 43 and 44 are provided on the top surface of the oscillator and a corresponding pair 43a and 44a—at opposite ends of the oscillator—are provided on the bottom surface of the oscillator. Through-openings are formed by chemical etching of upper case member 36, and lower case member 37 and quartz crystal vibrator plate 38.

Accordingly, by constructing and arranging a quartz crystal oscillator including a quartz crystal vibrator plate defining a tuning fork in accordance with the invention, it is possible to dispose electrodes to convenient positions for mounting the oscillator in an oscillator circuit without increasing processing steps. Therefore, the invention provides a convenient means for disposing electrodes and providing a low-priced ultra-thin quartz crystal oscillator. These oscillators are conveniently utilized in electronic timepieces.

It will thus be seen that the objects set forth above, among those made apparent from the preceding description, are efficiently attained and, since certain changes may be made in carrying out the above method and in the constructions set forth without department from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method for manufacturing a quartz crystal oscillator comprising:
   forming a quartz crystal vibrator plate having first and second opposed substantially planar surfaces, said plate defining a tuning fork vibrator having a base, two vibratory tines extending from the base and a frame integrally extending from the base and surrounding the tines and through means in the base of said plate for electrically connecting electrodes on one surface of said vibrator to the opposed surface;
   disposing thin-film surface electrodes on said surfaces of each tine;
   placing said vibrator between a pair of cooperating case members, one of said case members having two external oscillator electrodes disposed on the same surface;
   sealing said vibrator between said case members in the region of the base and frame; and
   disposing a coupling electrode in said through means.

2. The method of claim 1, wherein said vibrator is formed by chemical etching.

3. The method of claim 2, wherein said coupling electrode is disposed by sputtering.

4. A method for forming a quartz crystal oscillator comprising:
   selectively forming a tuning fork type quartz crystal vibrator from a quartz crystal plate, said vibrator having opposed substantially planar surfaces and a base with two vibratory tines extending from the base in one direction and a frame member integrally extending from the base in the same direction and surrounding the tines in circular fashion, an elongated support frame in the same plane as the vibrator and two projections extending from the base of the vibrator to the support frame for defining a opening in the plate, the vibrator, frame, projections and support frame being unitary;
   selectively disposing thin-film surface electrodes on both principal surfaces of the vibrator; and
   separating the support frame from the projections on the base of the vibrator;
   for forming a vibrator wherein electrode material is disposed between both surfaces through the opening between the two projections.

5. The method of claim 4, further including the step of sealing the vibrator between case members in the region of the base and frame surrounding the tines.

6. The method of claim 4, wherein the electrodes are formed by vacuum evaporation and deposition.

7. The method of claim 4, wherein the electrodes are disposed by sputtering.

8. The method of claim 4, wherein the electrodes are formed by sputtering and etching the undesired electrode portions.

9. A method for forming a plurality of quartz crystal oscillators comprising:
   selectively forming a plurality of tuning fork type quartz crystal vibrators from a quartz crystal plate, each of said vibrators having opposed substantially planar surfaces and a base with two vibratory tines extending from the base in one direction and a frame member integrally extending from the base in the same direction and surrounding the tines in circular fashion, an elongated support frame in the same plane as the vibrators and two projections extending from the base of each vibrator to the support frame for defining a opening in the plate, the vibrator, frame, projections and support frame being unitary;
   selectively disposing thin-film surface electrodes on both principal surfaces of each vibrator; and
   separating the support frame for the projections on the base of each vibrator;
   for forming vibrators wherein electrode material is disposed between both surfaces through the opening between the two projections.

10. The method of claim 4 or 9, wherein the electrodes formed on the surfaces of the vibrator include a first external oscillator electrode for providing a first electrical connection to the first of said surface electrodes being disposed on one surface of said oscillator frame in the region surrounding the tines and a second external oscillator electrode for providing a second electrical connection to the other of said surface electrodes being disposed on the opposed surface of said oscillator frame;
    electrode means disposed in said opening between said projections by sputtering for electrical coupling to said first external oscillator electrode on one surface of said vibrator and for coupling the first external oscillator electrode to the other surface, wherein the first external oscillator electrode on the other surface is insulated from said second external oscillator electrode, whereby said first and second external oscillator electrodes may be electrically connected to the external electrodes disposed on the same surface of a case members for enclosing the vibrator tines.

11. The method of claim 10, further including the step of placing the vibrator between a pair of cooperating case members, one of said case members having two external oscillator electrodes disposed on the same surface, sealing said vibrator between said case members in the region of the base and frame.

* * * * *